United States Patent
Jeon et al.

(10) Patent No.: US 10,559,678 B2
(45) Date of Patent: Feb. 11, 2020

(54) CASCODE CIRCUIT HAVING A GATE OF A LOW-SIDE TRANSISTOR COUPLED TO A HIGH-SIDE TRANSISTOR

(71) Applicant: SEMICONDUCTOR COMPONENTS INDUSTRIES, LLC, Phoenix, AZ (US)

(72) Inventors: Woochul Jeon, Phoenix, AZ (US); ALi Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/911,999

(22) Filed: Mar. 5, 2018

(65) Prior Publication Data

US 2018/0197851 A1 Jul. 12, 2018

Related U.S. Application Data

(62) Division of application No. 15/260,185, filed on Sep. 8, 2016, now Pat. No. 9,947,654.

(51) Int. Cl.
*H01L 29/778* (2006.01)
*H01L 49/02* (2006.01)
(Continued)

(52) U.S. Cl.
CPC ...... *H01L 29/7787* (2013.01); *H01L 27/0883* (2013.01); *H01L 28/40* (2013.01);
(Continued)

(58) Field of Classification Search
CPC . H01L 29/7787; H01L 29/7786; H01L 28/40; H01L 29/402; H01L 27/0883; H01L 29/2003
(Continued)

(56) References Cited

U.S. PATENT DOCUMENTS

| 3,801,933 A | 4/1974 | Teare |
| 2005/0225373 A1 | 10/2005 | Morita |

(Continued)

FOREIGN PATENT DOCUMENTS

| CN | 1210371 A | 3/1999 |
| WO | 0077934 A1 | 12/2000 |

OTHER PUBLICATIONS

Siemieniec, Ralf, et al., "The 1200V Direct-Driven SiC JFET Power Switch", Proceedings of the 2011-14th European conference on Power Electronics and Applications (EPE 2011), Aug. 30-Sep. 1, 2011, pp. 1-10.

(Continued)

*Primary Examiner* — Bo Fan
(74) *Attorney, Agent, or Firm* — Abel Schillinger, LLP

(57) ABSTRACT

In an aspect, a cascode circuit can include a high-side transistor and a low-side transistor. The source of the high-side transistor can be coupled to the drain of the low-side transistor; and the gate of the high-side transistor can be coupled to each of the source and the gate of the low-side transistor. In another aspect, an electronic device can include a high-side transistor, a low-side transistor, and a field electrode. The low-side transistor can include a drain region coupled to the source electrode of the high-side transistor. The field electrode can overlie and be capacitively coupled to a channel layer of the high-side transistor, wherein the field electrode is configured to be at a voltage between the voltages of the high-side and low-side power supply terminals.

13 Claims, 3 Drawing Sheets

(51) Int. Cl.
    *H01L 29/40*    (2006.01)
    *H01L 27/088*    (2006.01)
    *H01L 29/20*    (2006.01)

(52) U.S. Cl.
    CPC ........ *H01L 29/402* (2013.01); *H01L 29/7786* (2013.01); *H01L 29/2003* (2013.01)

(58) Field of Classification Search
    USPC ............ 307/66; 365/185.23, 158.18, 189.09; 257/300
    See application file for complete search history.

(56) References Cited

U.S. PATENT DOCUMENTS

| | | |
|---|---|---|
| 2007/0236274 A1 | 10/2007 | Huang et al. |
| 2010/0156483 A1* | 6/2010 | Mai ..................... H03L 7/0812 327/157 |
| 2010/0271133 A1 | 10/2010 | Bracale et al. |
| 2011/0102054 A1 | 5/2011 | Domes |
| 2011/0156483 A1* | 6/2011 | Caraghiorghiopol ... G06F 1/263 307/66 |
| 2014/0027785 A1 | 1/2014 | Rose |
| 2014/0049296 A1 | 2/2014 | Jeon et al. |
| 2016/0126906 A1 | 5/2016 | Maxim et al. |
| 2017/0062410 A1 | 3/2017 | Loechelt |

OTHER PUBLICATIONS

Aggeler, Daniel, et al., "Dv/Dt—Control Methods for the SiC JFET/Si MOSFET Cascode", IEEE Transactions on Power Electronics, vol. 28, No. 8, Aug. 2013, pp. 4074-4082.
Morita, Tatsuo, et al., "99.3% Efficiency of Three-Phase Inverter for Motor Drive Using GaN-Based Gate Injection Transistors", Institute of Electrical and Electronics Engineers, Applied Power and Electronics Conference and Exposition (APEC), Mar. 6-11, 2011, Fort Worth, TX, pp. 481-484.
Persson, Eric, "Practical Application of 600 V GaN HEMTs in Power Electronics", Professional Education Seminar S17, slide 50, Applied Power Electronics Conference 2015, Mar. 15-19, 2015, Charlotte, NC, pp. 1-78.
Wikipedia.com, "Coupling (electronics)", obtained from archive. org (aka "Wayback Machine"), published Jun. 4, 2016, p. 1.

* cited by examiner

CASCODE CIRCUIT HAVING A GATE OF A LOW-SIDE TRANSISTOR COUPLED TO A HIGH-SIDE TRANSISTOR

CROSS-REFERENCE TO RELATED APPLICATIONS

This application is a divisional application and claims priority under 35 U.S.C. § 120 to U.S. patent application Ser. No. 15/260,185 entitled "Cascode Circuit and an Electronic Device Including a Transistor and a Field Electrode," by Woochul Jeon et al., filed Sep. 8, 2016, which is assigned to the current assignee hereof and incorporated herein by reference in its entirety.

FIELD OF THE DISCLOSURE

The present disclosure relates to cascode circuits and electronic devices, and more particularly to, cascode circuits and electronic devices that include field electrodes.

RELATED ART

Charge carrier trapping can be an issue with nitrogen-containing layers. For a III-N transistor that has one or more layers including $Al_aGa_{(1-a)}N$, where $0<a\leq1$, electron trapping can adversely affect the on-state resistance ($R_{DSON}$), and hole trapping shift the threshold voltage of the transistors. $R_{DSON}$ can increase and cause the transistor to heat more and to operate less efficiently than if $R_{DSON}$ did not increase. The absolute value of a shift in threshold voltage may be in a range of 1 V to 5 V away from when where it was at an earlier time. A shifting threshold voltage can cause the transistor to be more unstable.

In a cascode circuit, a high-side transistor and a low-side transistor, where the circuit is typically controlled by signals provided to the gate of the low-side transistor. If the timing characteristics regarding turning off and turning off the transistors is too great, the high-side transistor may remain off or remain on significantly after the low-side transistor is turned on or turned off.

BRIEF DESCRIPTION OF THE DRAWINGS

Embodiments are illustrated by way of example and are not limited in the accompanying figures.

Figure 1:
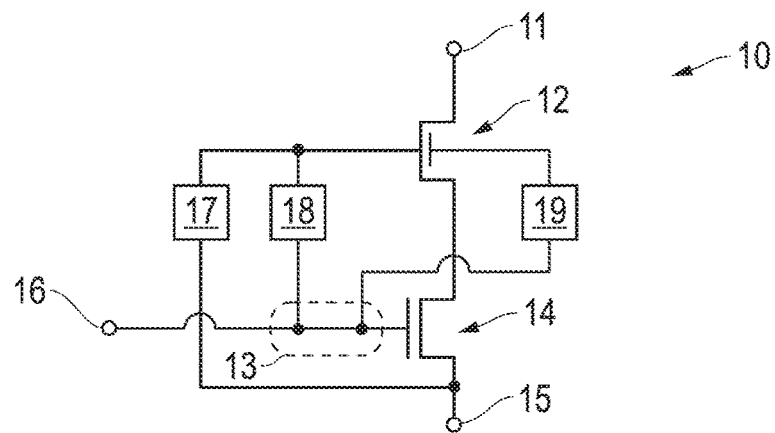
FIG. 1 includes a schematic diagram of a cascode circuit that allows for different coupling configurations for the gates of transistors within the cascode circuit.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_yGa_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In an aspect, a cascode circuit can include a high-side transistor including a source, a gate; and a low-side transistor including a drain, a source, and a gate. The source of the high-side transistor can be coupled to the drain of the low-side transistor; and the gate of the high-side transistor can be coupled to each of the source and the gate of the low-side transistor. In an embodiment, the gates of the high-side and low-side transistors may be capacitively coupled to each other, and the gate of the low-side transistor may be capacitively coupled to the body of the high-side transistor. In another embodiment, the gate of the high-side transistor may be resistively coupled to the gate and source of the low-side transistor. Other coupling configurations may be used without departing from the concepts described herein.

In another aspect, an electronic device can include a high-side transistor, a low-side transistor, and a field electrode. The high-side transistor can include a channel layer, a drain electrode overlying the channel layer and coupled to a high-side power terminal, and a source electrode overlying the channel layer. The low-side transistor can include a drain region coupled to the source electrode of the high-side transistor, and a source region coupled a low-side power supply terminal. The field electrode can overlie and be capacitively coupled to the channel layer of the high-side transistor, wherein the field electrode is configured to be at a voltage between the voltages of the high-side and low-side power supply terminals.

The circuit and electronic device can allow for less trapped charge carriers within a body or channel layer of a transistor, such as a III-N transistor, and less trapped charge carriers can result in a lower $R_{DSON}$, and less of a threshold voltage shift of the transistor. In another embodiment, an impedance element, such as a resistor, can be used to allow different transistors within a cascode circuit to have better matched turn on/off times.

FIG. 1 includes a circuit schematic of a cascode circuit 10 that includes a high-side transistor 12, and a low-side transistor 14. In an embodiment, high-side transistor 12 is a depletion-mode transistor, and the low-side transistor 14 is an enhancement-mode transistor. In an alternative embodiment, the low-side transistor 14 is a depletion-mode transistor. In a particular embodiment, the high-side transistor 12 is a depletion-mode high electron mobility transistor (HEMT), and the low-side transistor 14 is a Si metal-insulator-semiconductor field-effect transistor (MISFET). In another embodiment, the low-side transistor 14 is an enhancement-mode HEMT. In an embodiment, a drain of the high-side transistor 12 is coupled to a relatively high voltage power supply terminal 11, a source of the high-side transistor 12 is coupled to a drain of the low-side transistor 14 at a mid-node, and a source of the low-side transistor 14 is coupled to a relatively low voltage power supply terminal 15. The gate of the low-side transistor 14 can be coupled to a cascode circuit control terminal 16, which can be connected to a cascode circuit control module (not illustrated) that can include a gate driver circuit.

Blocks 17, 18, and 19 are representative of couplings that may or may not be present within the circuit. The block 17 is between the gate of the high-side transistor 12 and the source of the low-side transistor 14, the block 18 is between the gates of the transistors 12 and 14, and the block 19 is between the body or channel layer of the high-side transistor 12 and the gate of the low-side transistor 14. The blocks 18 and 19 and the gate of the low-side transistor 14 are electrically connected to one another at a node 13.

Each of the blocks 17 to 19 can be a type of coupling that includes an impendence element, a charge storage element, or an electrical connection. The impedance element can include a resistor or an inductor, and the charge storage element may include a capacitor. In an embodiment, at least one of the couplings for one of the blocks 17 to 19 will be different from a different block. For example, the block 17 may be an electrical connection, and the block 18 may be a charge storage element. Some combinations may not be used. For example, the blocks 17 and 18 will not be both electrical connections, as the cascode circuit control terminal 16 would be electrically shorted to the lower voltage power supply terminal 15. The block 19 is optional, and the body or channel layer may not be coupled to the gate of the low-side transistor 12.

Figure 2:
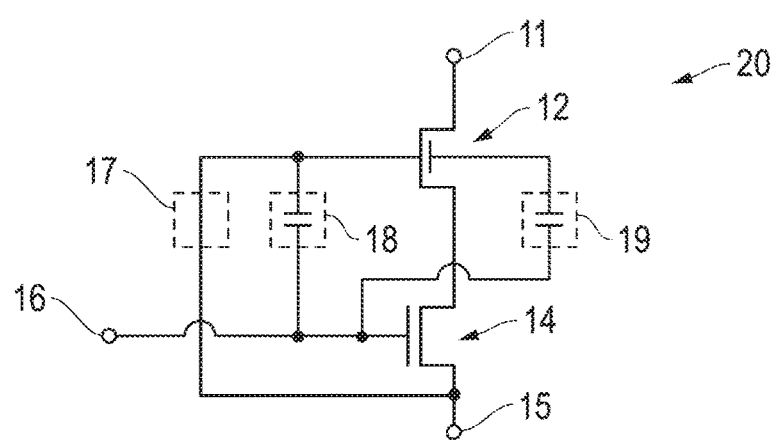
FIG. 2 includes a schematic diagram of a cascode circuit where a gate of a low-side transistor is capacitively coupled to a gate and a channel layer of a high-side transistor.

FIG. 2 includes a circuit schematic of a cascode circuit 20, where the block 17 is an electrical connection and each of the blocks 18 and 19 is a charge storage element. In a particular embodiment, the gate of the high-side transistor 12 is electrically connected to the source of the low-side transistor 14, and the gate of the low-side transistor 14 is capacitively coupled to each of the gate and the channel layer of the high-side transistor 12. The circuit can be useful for III-N transistors to reduce the amount of trapped electrons in the channel layer of the high-side transistor 12, as electrons that would otherwise be trapped within the channel layer can migrate into a barrier layer overlying the channel layer of the high-side transistor 12.

Figure 3:
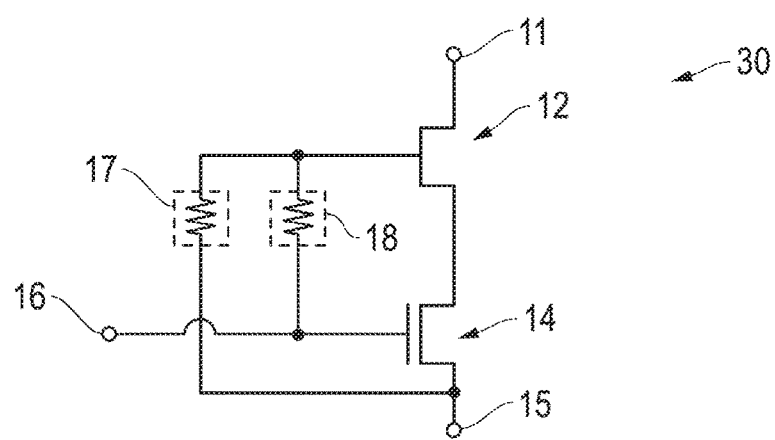
FIG. 3 includes a schematic diagram of a cascode circuit where a gate of a high-side transistor is coupled to a gate and a source of a low-side transistor.

FIG. 3 includes a circuit schematic of a cascode circuit 30, where each of the blocks 17 and 18 is an impedance element, and the block 19 is not present. In a particular embodiment, the gate of the high-side transistor 12 is resistively coupled to the source and gate of the low-side transistor 14. In a particular embodiment, a resistor (block 18) electrically connected between the gates of the transistors 12 and 14 and helps to match more closely the on/off times of the transistors 12 and 14. Another resistor (block 17) is electrically connected between the gate of the high-side transistor 12 and the source of the low-side transistor 14, and such other resistor has a greater resistance that the resistor corresponding to block 18. The resistors for the blocks 17 and 18 form a voltage divider and allow the on-state voltage of the gate of the high-side transistor 12 to be an intermediate value between the voltage at the cascode circuit control terminal 16 and the source of the low-side transistor 14. Accordingly, the resistors can help to limit the voltage on the gate of the high-side transistor 12, as too high of a gate voltage may result in too much undesired leakage current. The resistors may be incorporated into the same die as the high-side transistor, the low-side transistor 12, or as discrete components.

Figure 4:
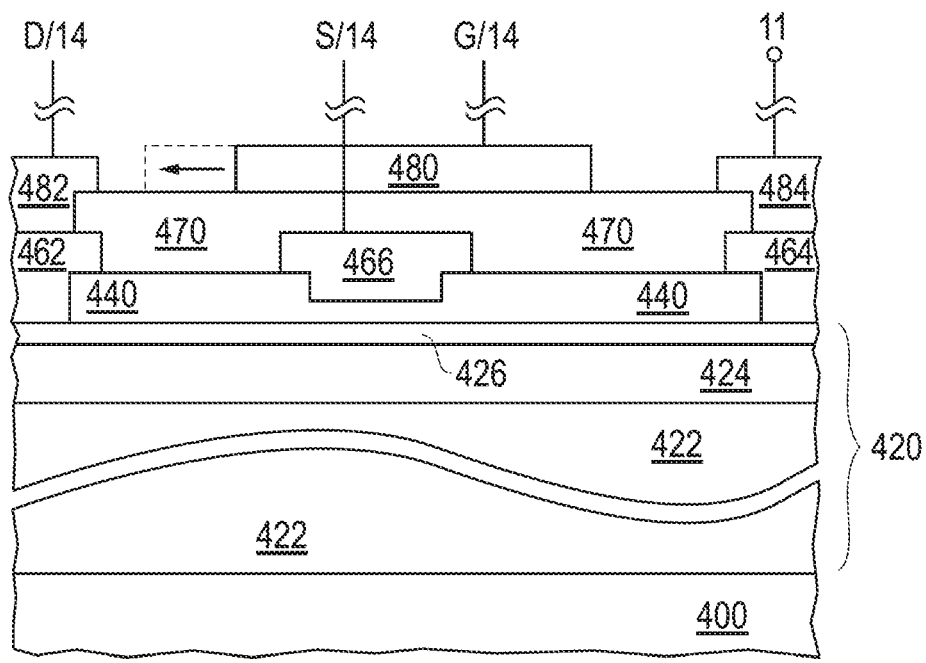
FIG. 4 includes a cross-sectional view of a portion of a workpiece that includes a transistor where a gate electrode and channel layer of the transistor is capacitively coupled to a field electrode.
Figure 5:
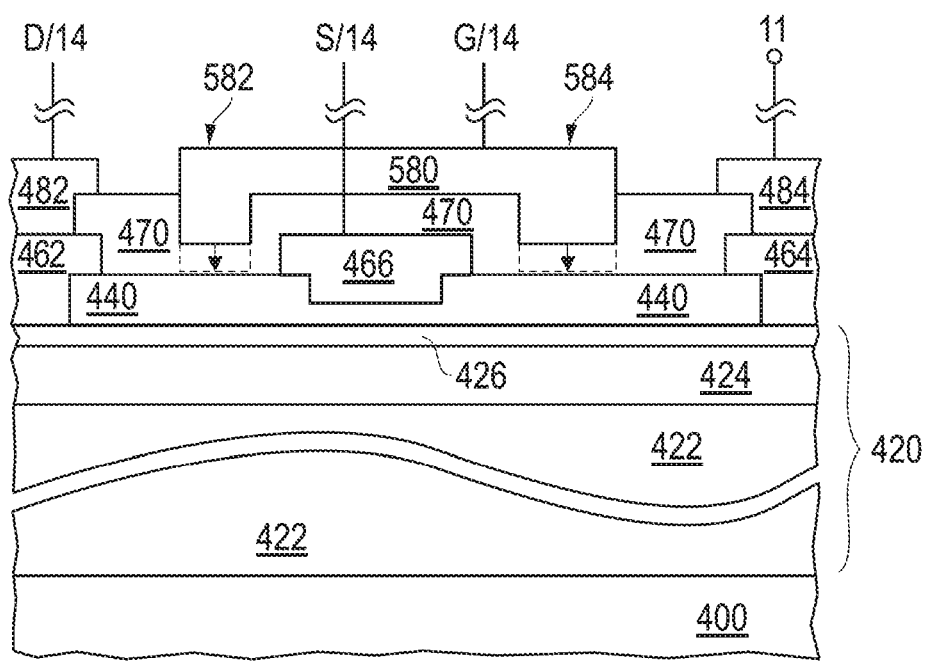
FIG. 5 includes a cross-sectional view of a portion of a workpiece that includes a transistor where a gate electrode and channel layer of the transistor is capacitively coupled to a field electrode.
Figure 6:
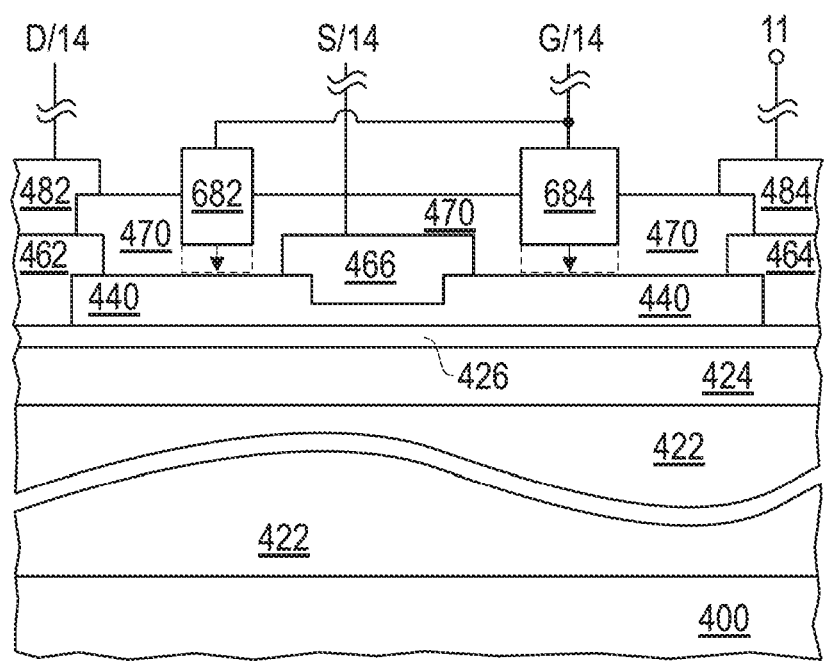
FIG. 6 includes a cross-sectional view of a portion of a workpiece that includes a transistor where a channel layer of the transistor is capacitively coupled to a field electrode.

FIGS. 4 to 6 include cross-sectional views of electronic devices that include high-side transistors in accordance with exemplary, non-limiting embodiments. Such embodiments can help to reduce the likelihood of trapping charge carriers within a channel layer of the high-side transistor. The high-side transistor illustrated in FIGS. 4 to 6 may be used for the high-side transistor 12 in previously described circuits. Although not illustrated, the low-side transistor 14 may be on the same die as the high-side transistor in each of FIGS. 4 to 6 or may be on a different die.

In FIG. 4, the high-side transistor that includes a substrate 400, a semiconductor stack 420, and a dielectric layer 440. The substrate 400 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the semiconductor stack 420 that will be subsequently formed over the substrate 400.

The semiconductor stack 420 can include a buffer layer 422, a channel layer 424, and a barrier layer 426. Each of the layers within the semiconductor stack 420 can include a III-N semiconductor material, and in a particular embodiment include $Al_xGa_{(1-x)}N$, where $0 \le x \le 1$. The composition of the buffer layer 422 may depend on the composition of the channel layer 424. The composition of the buffer layer 422 can be changed as a function of thickness, such that the buffer layer 422 has a relatively greater aluminum content closer to the substrate 400 and relatively greater gallium content closer to the channel layer 424. In a particular embodiment, the cation (metal atoms) content in the buffer layer 422 near the substrate 400 can be 10% to 100% Al with the remainder Ga, and the cation content in the buffer layer 422 near the channel layer 424 can be 0% to 50% Al with the remainder Ga. The buffer layer 422 can have a thickness in a range of approximately 1 micron to 5 microns.

The channel layer 424 can include $Al_yGa_{(1-y)}N$, where $0 \le x \le 0.1$ and have a thickness in a range of approximately 20 nm to 4000 nm. In a particular embodiment, the channel layer 424 is a GaN layer that may doped with an electron acceptor dopant. The barrier layer 426 can be used to help reduce the likelihood of migration of contaminants or other materials between one or more layers underlying the barrier layer 426 and the dielectric layer 440. In a particular embodiment, the barrier layer 426 can include $Al_yGa_{(1-y)}N$, wherein $0.05 \le y \le 0.3$. The barrier layer 426 can have a thickness in a range of approximately 2 to 30 nm. The semiconductor stack 420 is formed using an epitaxial growth technique, and thus the channel layer 424 and barrier layer 426, and at least a portion of the buffer layer 422 can be monocrystalline. In a particular embodiment, metal-containing films can be formed using metalorganic chemical vapor deposition. In another embodiment, different composition for the semiconductor stack 420 may be used, e.g., InAlGaN, InP, or the like.

The dielectric layer 440 can include a gate dielectric film, an intermediate film, and a capping film. The different films within the dielectric layer 440 are not illustrated to simplify understanding of concepts as described herein. In an embodiment, the gate dielectric film can be formed to protect the underlying layers present over the substrate 400. In an embodiment, the gate dielectric film can include a silicon nitride, an aluminum oxide, a zirconium oxide, a hafnium oxide, a niobium oxide, another suitable dielectric material, or any combination thereof and have a thickness in a range of 5 nm to 60 nm. The intermediate film can act as an etch-stop layer when etching the capping film. In an embodiment, the intermediate film can include AlN and have a thickness in a range of 2 nm to 20 nm. The capping film can protect the gate dielectric film. In an embodiment, the capping film can include silicon nitride and have a thickness in a range of 20 nm to 500 nm. In another embodiment, the dielectric layer 440 can include fewer or more films that may have the same or different compositions as described. When the intermediate film includes AlN, an optional $Al_2O_3$ film (not illustrated) can be formed by oxidizing a portion of the intermediate film in an oxidizing ambient, such as $O_2$, $N_2O$, or the like. The dielectric layer 440 or any films of the dielectric layer 440 can be formed using a chemical or physical vapor technique.

In an embodiment, the semiconductor stack 420, and at least one of the films of the dielectric layer 440 are formed without exposing the workpiece to air or another oxygen-containing gas. Thus, the layers and films can be formed little or no oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric film, the workpiece may be exposed to air before forming the capping film.

A source electrode 462, and drain 464, and a gate electrode 466 are formed. In an embodiment, the dielectric layer 440 is patterned to define contact openings that expose the barrier film 426. Some or all of the barrier film 426 may also be removed. The source and drain electrodes 422 and 424 can be formed within the contact openings.

The capping film can be patterned to define an opening that extends through at least some of thickness of the dielectric layer 440 for the gate electrode 466. The intermediate film may or may not be patterned in defining the opening. The gate electrode 466 is formed within the opening. In another embodiment, the dielectric layer 440 may be patterned similar to the depletion-mode transistor. However, a GaN layer that is heavily doped with an electron acceptor may be formed within the opening. A conductive layer can be deposited and patterned, so the gate electrode 466 includes the heavily doped GaN and conductive layer. In a further embodiment, the capping film may be patterned as previously described, and the intermediate film may be oxidized or an oxide film can be formed within the opening before forming the gate electrode 466. After reading this specification, skilled artisans will be able to select the formation process for the gate electrode 466 to meet the needs or desires for a particular application.

An interlevel dielectric (ILD) layer 470 is formed over the dielectric layer 440 and the electrodes 462, 464, and 466 as illustrated in FIG. 4. The ILD layer 470 can include one or more insulating films. The ILD layer 470 is etched to define openings to the electrodes 462 and 464. A conductive layer is deposited and patterned to form a field electrode 480 and interconnects 482 and 484. Although not illustrated in FIG. 4, an opening through the ILD layer 470 extends to the gate electrode 466 and an interconnect make electrical contact to the gate electrode 466. Additional ILD layers, interconnects, and field electrodes can be formed to make substantially completed electronic device. As illustrated by the dashed line and arrow in FIG. 4, the field electrode 480 can be extended to be closer to the interconnect 482 that overlies and is in contact with the source electrode 462. In a finished electronic device, the field electrode 480 is electrically connected to the gate of the low-side transistor 14 (designated as G/14 in FIG. 4), the source electrode 462 is electrically connected to the drain of the low-side transistor 14 (designated as D/14 in FIG. 4), the gate electrode 466 is electrically connected to the source of the low-side transistor 14 (designated at S/14 in FIG. 4) and the drain electrode 464 is electrically connected to the high power supply terminal 11.

The cascode circuit is turned on when a positive voltage, such as +5 V to +15 V, is applied at the gate of the low-side transistor 14. The field electrode 480 is electrically connected to the gate of the low-side transistor 14 and will be at such positive voltage. Trapped electrons can migrate toward the field electrode 480 and reduce $R_{DSON}$, and trapped holes can be pushed away and reduce the shift of threshold voltage.

FIG. 5 includes an alternative embodiment in which the field electrode 580 has a portion 582 between the source and gate electrodes 462 and 466 and another portion 584 between the gate and drain electrodes 466 and 464. In an embodiment, the gate electrode 466 has an uppermost elevation at a location overlying the channel layer 424, and the field electrode 580 includes portions 582 and 584 that lie at an elevation lower than the uppermost elevation of the gate electrode 466. The portions 582 and 584 may extend partly (solid line) or completely (dashed line) through the ILD layer 470. In another embodiment, the dielectric layer 440 also can be partially etched under the portions 582 and 584; however, the depth may not be deeper than gate recess within the dielectric layer 440 under the gate electrode 466. The portions 582 and 584 can increase the capacitive coupling between the field electrode 580 and the channel layer 424, as compared to the field electrode 480.

FIG. 6 includes an alternative embodiment in which the field electrode has a portion 682 between the source and gate electrodes 462 and 466 and another portion 684 between the gate and drain electrodes 466 and 464. The portions 682 and 684 are connected at a location that is not illustrated in FIG. 6. The field electrode in FIG. 6 does not include a portion that overlies the gate electrode 466, as seen with the field electrode 580 in FIG. 5. The configuration of the field electrode in FIG. 6 reduces capacitive coupling between the gates of the transistors 12 and 14 and allows the circuit to operate faster.

Embodiments of the cascode circuits and electronic devices as described herein have benefits over conventional cascode circuits and electronic devices. A variety of coupling elements can be used in a cascode circuit to improve performance of the circuit. A charge storage element, such as a capacitor, can be used to reduce trapped charge carriers within a body or channel layer of a transistor. In a particular embodiment, a field electrode can be used and biased to attract trapped electrons from the channel layer and repel trapped holes from a channel layer. In a different embodiment, impedance elements, such as resistors can be used to allow different transistors within a cascode circuit to adjust the on-state gate voltage for the high-side transistor 12 and to have on/off times for the transistors 12 and 14 that are better matched to each other.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A cascode circuit can include a high-side transistor including a source, a gate; and a low-side transistor including a drain, a source, and a gate, wherein the source of the high-side transistor is coupled to the drain of the low-side transistor; and the gate of the high-side transistor is coupled to each of the source and the gate of the low-side transistor.

Embodiment 2

The circuit of Embodiment 1, further including a first coupling element having a first terminal and a second terminal, wherein the first terminal of the first coupling element is electrically connected to the gate of the high-side transistor, and a second terminal of the first coupling element is electrically connected to the source of the low-side transistor or the gate of the low-side transistor.

Embodiment 3

The circuit of Embodiment 2, wherein the first coupling element is a resistor or a capacitor.

Embodiment 4

The circuit of Embodiment 3, wherein the second terminal of the first coupling element is electrically connected to gate of the low-side transistor, and the gate of the high-side transistor is electrically connected to the source of the low-side transistor.

Embodiment 5

The circuit of Embodiment 2, further including a second coupling element having a first terminal and a second terminal, wherein:
the first terminal of the first coupling element is electrically connected to the gate of the high-side transistor, and a second terminal of the first coupling element is electrically connected to the gate of the low-side transistor; and
the first terminal of the second coupling element is electrically connected to a body of the high-side transistor, and a second terminal of the second coupling element is electrically connected to the gate of the low-side transistor.

Embodiment 6

The circuit of Embodiment 5, wherein the first coupling element is a capacitor, and the second coupling element is a capacitor.

Embodiment 7

A cascode circuit can include:
a high-side transistor including a source, a gate, and a body; and
a low-side transistor including a drain, a source, and a gate,
wherein:
the source of the high-side transistor is coupled to the drain of the low-side transistor;
the gate of the high-side transistor is coupled to the source of the low-side transistor; and
the body of the high-side transistor is coupled to the gate of the low-side transistor.

Embodiment 8

The circuit of Embodiment 7, further including a first coupling element having a first terminal and a second terminal, wherein the first terminal of the first coupling element is electrically connected to the body of the high-side transistor, and a second terminal of the first coupling element is electrically connected to the gate of the low-side transistor.

Embodiment 9

The circuit of Embodiment 8, wherein the first coupling element is a capacitor.

Embodiment 10

The circuit of Embodiment 9, further including a second coupling element having a first terminal and a second terminal, wherein the first terminal of the second coupling element is electrically connected to the gate of the high-side transistor, and a second terminal of the second coupling element is electrically connected to the gate of the low-side transistor.

Embodiment 11

An electronic device can include:
a high-side transistor including:
  a channel layer;
  a drain electrode overlying the channel layer and coupled to a high-side power terminal; and
  a source electrode overlying the channel layer;
a low-side transistor including:
  a drain region coupled to the source electrode of the high-side transistor; and
  a source region coupled a low-side power supply terminal; and
a field electrode overlying and capacitively coupled to the channel layer of the high-side transistor, wherein the field electrode is configured to be at a voltage between the voltages of the high-side and low-side power supply terminals.

Embodiment 12

The electronic device of Embodiment 11, wherein the low-side transistor further includes a gate electrode that is coupled to the field electrode.

Embodiment 13

The electronic device of Embodiment 12, wherein the high-side transistor is a depletion-mode transistor, and the low-side transistor is an enhancement-mode transistor.

Embodiment 14

The electronic device of Embodiment 11, wherein the high-side transistor further includes a gate electrode, wherein the field electrode overlies and is not electrically connected to the gate electrode of the high-side transistor.

Embodiment 15

The electronic device of Embodiment 14, wherein:
the gate electrode of the high-side transistor has an uppermost elevation at a location overlying the channel layer and between the source and drain electrodes of the high-side transistor; and
the field electrode includes a portion that lies at an elevation lower than the uppermost elevation at the location.

Embodiment 16

The electronic device of Embodiment 14, wherein the portion is laterally disposed between the gate electrode of the high-side transistor and the drain electrode of the high-side transistor.

Embodiment 17

The electronic device of Embodiment 14, wherein the portion is laterally disposed between the gate electrode of the high-side transistor and the source electrode of the high-side transistor.

Embodiment 18

The electronic device of Embodiment 14, wherein between the source and drain electrodes of the high-side transistor, a lowermost elevation of the field electrode is higher than an uppermost elevation of the gate electrode, and the lowermost elevation is less than 0.9 micron from the channel layer.

Embodiment 19

The electronic device of Embodiment 14, wherein the field electrode is capacitively coupled to the gate of the high-side transistor.

Embodiment 20

The electronic device of Embodiment 19, wherein:
the high-side transistor is a depletion-mode transistor;
the low-side transistor is an enhancement-mode transistor;
the drain electrode of the high-side transistor is electrically connected to the high-side power supply terminal;
the gate electrode of the high-side transistor is coupled to the source region of the low-side transistor;
the source electrode of the high-side transistor is electrically connected to the drain region of the low-side transistor;
the gate electrode of the low-side transistor is electrically connected to the field electrode; and
the source region of the low-side transistor is electrically connected to the low-side power supply terminal.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A cascode circuit comprising:
a high-side transistor including a source, a gate, and a body; and
a low-side transistor including a drain, a source, and a gate; and
a first coupling element having a first terminal and a second terminal,
wherein:
the source of the high-side transistor is coupled to the drain of the low-side transistor,
the gate of the high-side transistor is coupled to the source of the low-side transistor,
the body of the high-side transistor is coupled to the gate of the low-side transistor,
the first terminal of the first coupling element is electrically connected to the gate of the high-side transistor,
the second terminal of the first coupling element is electrically connected to the source of the low-side transistor, and
the first coupling element includes an impendence element, a charge storage element, or an electrical connection.

2. The cascode circuit of claim 1, wherein the first terminal of the first coupling element is electrically connected to the body of the high-side transistor, and the second terminal of the first coupling element is electrically connected to the gate of the low-side transistor.

3. The cascode circuit of claim 2, wherein the first coupling element is a capacitor.

4. The cascode circuit of claim 1, wherein the high-side transistor is a high electron mobility transistor.

5. The cascode circuit of claim 1, wherein the high-side transistor is a depletion-mode transistor.

6. The cascode circuit of claim 5, wherein the low-side transistor is an enhancement-mode transistor.

7. The cascode circuit of claim 1, further comprising a capacitor having a first electrode and a second electrode, wherein:
the high-side transistor is a depletion-mode high electron mobility transistor,
the low-side transistor is an enhancement-mode metal-insulator-semiconductor field-effect transistor,
the first electrode of the capacitor is electrically connected to the body of the high-side transistor,
the second electrode of the capacitor is electrically connected to the gate of the low-side transistor, and
the gate of the high-side transistor is electrically connected to the source of the low-side transistor.

8. The cascode circuit of claim 1, further comprising a second coupling element having a first terminal and a second terminal, wherein the first terminal of the second coupling element is electrically connected to the gate of the high-side transistor, and the second terminal of the second coupling element is electrically connected to the gate of the low-side transistor.

9. The cascode circuit of claim 8, wherein the second coupling element is a capacitor.

10. A cascode circuit comprising:
a high-side transistor including a source and a gate;
a low-side transistor including a drain, a source, and a gate;
a first coupling element having a first terminal and a second terminal; and
a second coupling element having a first terminal and a second terminal, wherein:
the source of the high-side transistor is coupled to the drain of the low-side transistor,
the gate of the high-side transistor is coupled to each of the source and the gate of the low-side transistor,
the first terminal of the first coupling element is electrically connected to the gate of the high-side transistor,
the second terminal of the first coupling element is electrically connected to the gate of the low-side transistor,
the first coupling element includes an impendence element, a charge storage element, or an electrical connection,
the first terminal of the second coupling element is electrically connected to the gate of the high-side transistor, and
the second terminal of the second coupling element is electrically connected to the source of the low-side transistor.

11. The cascade circuit of claim 10, wherein the first coupling element is a charge storage element.

12. The cascade circuit of claim 10, wherein the second coupling element is an electrical connection.

13. A cascode circuit comprising:
a high-side transistor including a source, a gate, and a body;
a low-side transistor including a drain, a source, and a gate;
a first coupling element having a first terminal and a second terminal; and
a second coupling element having a first terminal and a second terminal,
wherein:
the source of the high-side transistor is coupled to the drain of the low-side transistor,
the gate of the high-side transistor is coupled to the source of the low-side transistor,
the body of the high-side transistor is coupled to the gate of the low-side transistor,
the first terminal of the first coupling element is electrically connected to the gate of the high-side transistor,
the second terminal of the first coupling element is electrically connected to the gate of the low-side transistor,
the first terminal of the second coupling element is electrically connected to the gate of the high-side transistor, and
the second terminal of the second coupling element is electrically connected to the source of the low-side transistor.

* * * * *

UNITED STATES PATENT AND TRADEMARK OFFICE
CERTIFICATE OF CORRECTION

PATENT NO. : 10,559,678 B2
APPLICATION NO. : 15/911999
DATED : February 11, 2020
INVENTOR(S) : Woochul Jeon and Ali Salih Page 1 of 1

It is certified that error appears in the above-identified patent and that said Letters Patent is hereby corrected as shown below:

In the Claims

Column 13, Line 21, please replace "cascade" with --cascode--.

Column 13, Line 23, please replace "cascade" with --cascode--.

Signed and Sealed this
Thirty-first Day of March, 2020

Andrei Iancu
*Director of the United States Patent and Trademark Office*